(12) United States Patent
Sasaki et al.

(10) Patent No.: US 9,348,004 B2
(45) Date of Patent: May 24, 2016

(54) MAGNETIC SENSOR, MAGNETIC HEAD, AND BIOMAGNETIC SENSOR

(71) Applicant: TDK CORPORATION, Tokyo (JP)

(72) Inventors: Tomoyuki Sasaki, Tokyo (JP); Tohru Oikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 72 days.

(21) Appl. No.: 14/341,378

(22) Filed: Jul. 25, 2014

(65) Prior Publication Data

US 2015/0035524 A1 Feb. 5, 2015

(30) Foreign Application Priority Data

Aug. 2, 2013 (JP) ................................. 2013-161135
Jul. 23, 2014 (JP) ................................. 2014-149747

(51) Int. Cl.
*G11B 5/33* (2006.01)
*G01R 33/09* (2006.01)
*G01R 33/12* (2006.01)
*G11B 5/39* (2006.01)

(52) U.S. Cl.
CPC .......... *G01R 33/093* (2013.01); *G01R 33/1269* (2013.01); *G01R 33/1284* (2013.01); *G11B 5/3909* (2013.01); *G11B 2005/3996* (2013.01)

(58) Field of Classification Search
CPC ...... G11C 11/16; G11C 11/161; G11C 11/15; G11C 11/1675; G11C 11/5607; H01L 43/08; H01L 43/12; H01L 27/228; H01L 29/66984; B82Y 25/00; Y10T 428/1114; H01F 10/3254; G01R 33/1284; G01R 33/098; G01R 33/093
See application file for complete search history.

(56) References Cited

U.S. PATENT DOCUMENTS

| | | | |
|---|---|---|---|
| 7,209,328 B2 | 4/2007 | Ito et al. | |
| 7,969,692 B2 | 6/2011 | Takahashi | |
| 8,085,513 B2 * | 12/2011 | Sasaki .................. | B82Y 10/00 360/324.2 |
| 2012/0038355 A1 * | 2/2012 | Sasaki ................ | G01R 33/1284 324/244 |

FOREIGN PATENT DOCUMENTS

| | | |
|---|---|---|
| JP | A-2007-299467 | 11/2007 |
| JP | B2-4029772 | 1/2008 |
| JP | A-2010-113788 | 5/2010 |

OTHER PUBLICATIONS

Sasaki et al., "Electrical Spin Injection into Silicon Using MgO Tunnel Barrier," *Applied Physics Express 2*, The Japan Society of Applied Physics, May 15, 2009.

* cited by examiner

*Primary Examiner* — Alesa Allgood
(74) *Attorney, Agent, or Firm* — Oliff PLC

(57) ABSTRACT

A magnetic sensor includes a channel layer, a magnetization free layer placed on a first section of the channel layer, and a magnetization-fixed layer placed on a second section of the channel layer. A thickness of the channel layer of the first section is different from a thickness of the channel layer of the second section and a resistance of an interface between the channel layer and the magnetization free layer is lower than a resistance of an interface between the channel layer and the magnetization-fixed layer.

5 Claims, 6 Drawing Sheets

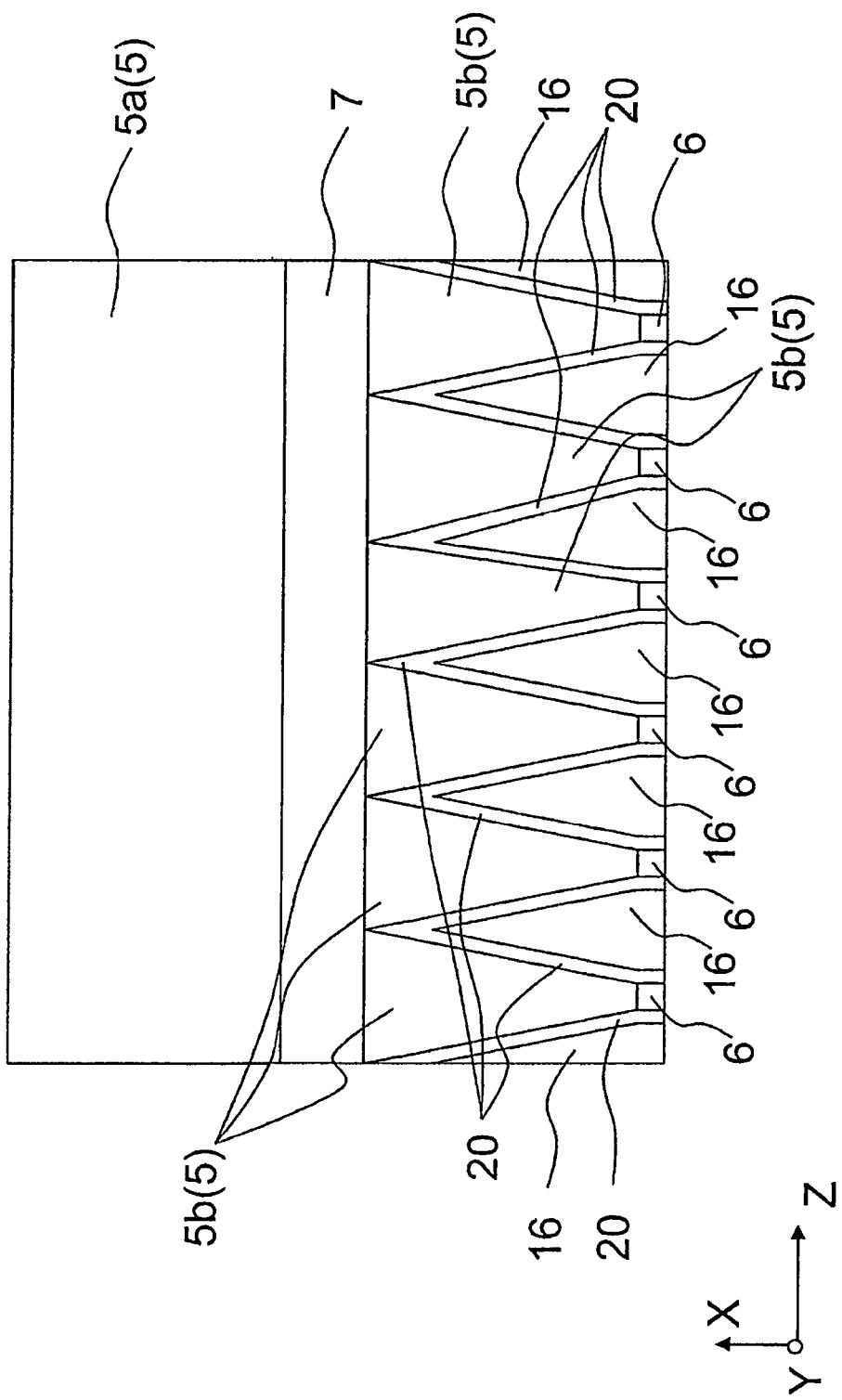

MAGNETIC SENSOR, MAGNETIC HEAD, AND BIOMAGNETIC SENSOR

BACKGROUND

The present invention relates to a magnetic sensor, a magnetic head, and a biomagnetic sensor.

Magnetoresistive elements are known as magnetic sensors for use in thin-film magnetic recording/reproducing heads. In general, a magnetoresistive element applies a current between a magnetization-fixed layer and a magnetization free layer and therefore obtains high output. However, the magnetoresistive element obtains a signal, caused by the motion of a domain wall due to current-induced spin torque or the like, unnecessary for magnetic sensors.

On the other hand, spin accumulation (SA) magnetic sensors in which a magnetization free layer and a magnetization-fixed layer are formed on the same horizontal surface (a channel layer for accumulating spins) are known (refer to, for example, Patent References 1 and 2). For example, in the case of using a spin accumulation magnetic sensor in a thin-film magnetic recording/reproducing head, no current needs to be applied to a magnetization free layer detecting the external magnetic field of a magnetic recording medium or the like. That is, in the spin accumulation magnetic sensor, magnetic condition can be detected in the form of an output voltage using a spin current only.

CITED REFERENCES

Patent References

[Patent Reference 1] Japanese Unexamined Patent Application Publication No. 2007-299467
[Patent Reference 2] Japanese Patent No. 4029772
[Patent Reference 3] Japanese Unexamined Patent Application Publication No. 2010-113788

SUMMARY

In order to put spin accumulation magnetic sensors to practical use, some problems need to be solved. One of the problems is noise. In the case of, for example, a magnetoresistive magnetic sensor, a multilayer film to which a current is applied and a multilayer film detecting a voltage are the same and therefore the resistance of the multilayer films can be a cause of Johnson noise or the like. In the case of a spin accumulation magnetic sensor, a current is applied between a channel layer and a multilayer film for applying spins to the channel layer, whereby spins are injected into the channel layer. The applied current is a cause of noise. The noise of a current acts as the noise of a spin flow and is detected in the form of output. One of solutions for this is to increase the cross-sectional area of a multilayer film in contact with a channel layer as disclosed in, for example, Patent Reference 3. However, any solution for noise due to the detection side of a spin flow is not described therein.

In the case of a spin accumulation magnetic head, a magnetization free layer detecting external magnetic flux needs to be smaller than a magnetization-fixed layer in order to enhance spatial resolution with respect to external magnetic flux and therefore the magnetization free layer generally has higher interfacial resistance. This applies to the case where the magnetization free layer is used as an injection source of a spin flow and the case where the magnetization free layer is used as an electrode for detecting a spin flow. When the resistance of the interface between the magnetization free layer and a channel layer is high, there is a problem in that Johnson noise proportional to circuit resistance increases.

The present invention has been made in view of the above circumstances. It is an object of the present invention to provide a magnetic sensor capable of reducing noise.

In order to solve the above problems, a magnetic sensor according to the present invention is characterized by including a channel layer, a magnetization free layer placed on a first section of the channel layer, and a magnetization-fixed layer placed on a second section of the channel layer. A thickness $d1$ of the channel layer of the first section is different from a thickness $d2$ of the channel layer of the second section and a resistance of an interface between the channel layer of the first section and the magnetization free layer is lower than a resistance of an interface between the channel layer of the second section and the magnetization-fixed layer.

Since the resistance of the interface between the magnetization free layer and the channel layer is lower than the resistance of the interface between the magnetization-fixed layer and the channel layer, noise on the detection side can be reduced.

In the present invention, the resistance of an interface refers to the resistance between the channel layer and a ferromagnetic layer in the magnetization free layer or the magnetization-fixed layer and the resistance of an interface includes the resistance due to a tunnel barrier layer or Schottky barrier placed between the ferromagnetic layer and the channel layer or the resistance due to both thereof.

The thickness $d1$ of the channel layer of the first section, that is, the thickness of the channel layer under the magnetization free layer is preferably less than the thickness $d2$ of the channel layer of the second section, that is, the thickness of the channel layer under the magnetization-fixed layer. This case is preferred because spatial resolution with respect to external magnetic flux is high.

The thickness $d2$ of the channel layer of the second section is preferably less than the thickness $d1$ of the channel layer of the first section. The output obtained in this case is higher than that obtained in the case where the thickness $d2$ of the channel layer of the first section is less than the thickness $d2$ of the channel layer of the second section.

A magnetic head according to the present invention may be a magnetic head including a reading head section including the above magnetic sensor and a recording head section for writing. In this case, the top, bottom, left, and right of a magnetization free layer detecting external magnetic flux are preferably covered by magnetic shields. The distance (read gap) between the upper and lower magnetic shields is spatial resolution for detecting external magnetic flux. In the read gap, there are at least three layers: an insulating layer for electrically and magnetically insulating the lower magnetic shield from the channel layer of a portion in which spins are transported, the channel layer of the portion in which spins are transported, and the magnetization free layer. When the thickness $d1$ of the channel layer of the first section, that is, the thickness of the channel layer under the magnetization free layer is less than the thickness $d2$ of the channel layer of the second section, that is, the thickness of the channel layer under the magnetization-fixed layer, the distance of the read gap is narrow and therefore spatial resolution becomes higher.

A biomagnetic sensor according to the present invention may be a biomagnetic sensor in which a plurality of magnetic sensors described above are arranged. The less the distance between a magnetization free layer and a magnetization-fixed layer is, the higher output the biomagnetic sensor obtains. Arranging a plurality of the magnetic sensors enables where fine magnetic particles are located, the number of the fine magnetic particles, and the size thereof to be detected.

According to the present invention, a magnetic sensor capable of reducing noise can be provided.

BRIEF DESCRIPTION OF THE DRAWINGS

FIG. 5 is a schematic view of a thin-film magnetic recording/reproducing head 100A including a magnetic sensor 100a.

FIG. 6 is a schematic view of a biomagnetic sensor in which a plurality of magnetic sensors are arranged.

DETAILED DESCRIPTION OF EMBODIMENTS

Figure 1:
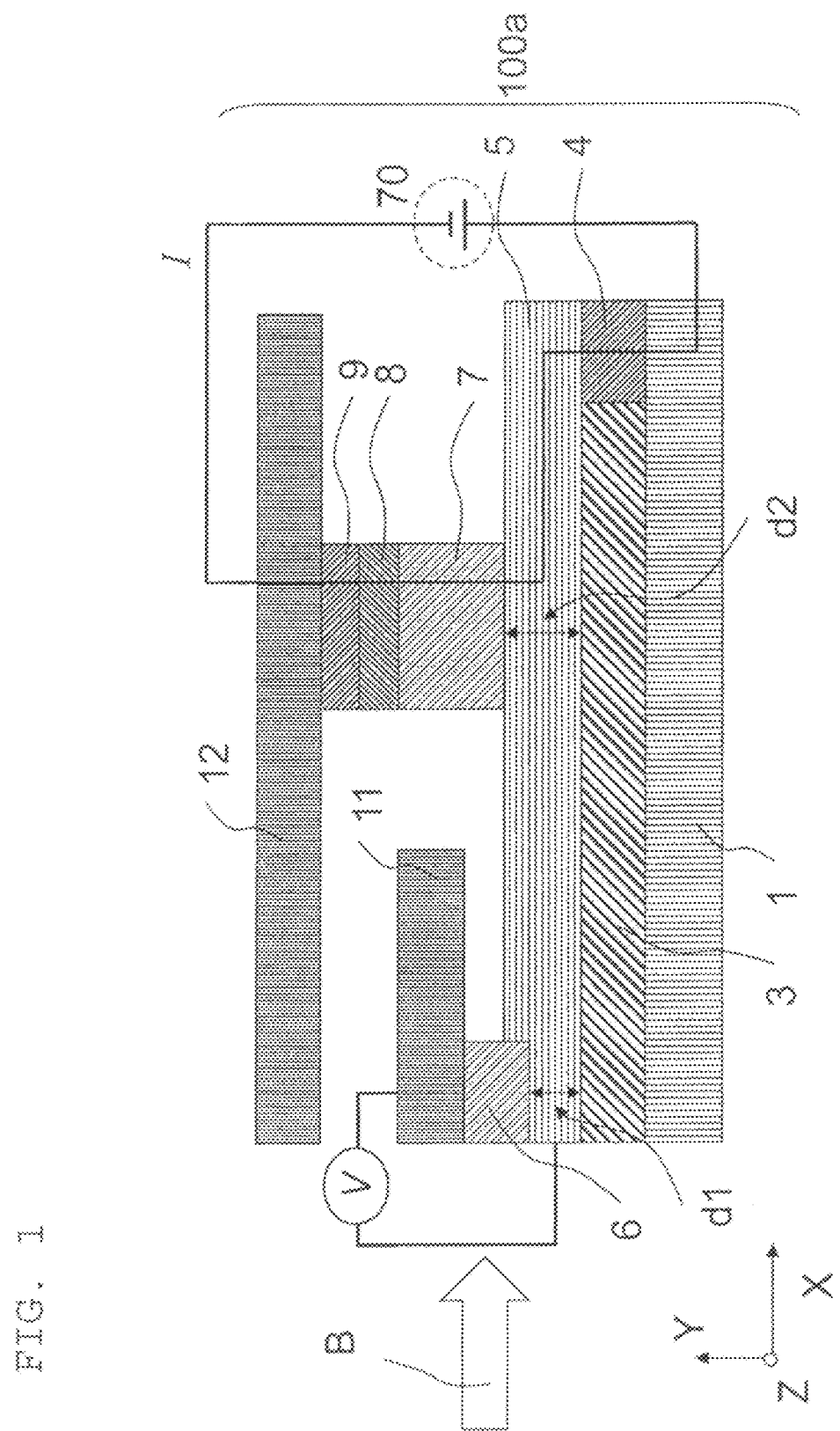
FIG. 1 is a schematic sectional view of a magnetic sensor according to an embodiment of the present invention.

Embodiments of the present invention are described below in detail with reference to the attached drawings. In the description of the drawings, the same components are designated by the same reference numerals and will not be described redundantly.

(First Mode)

The following sensor is described below as an example of a magnetic sensor according to a first embodiment: a magnetic sensor in the case where the thickness d1 of a channel layer of a first section, that is, the thickness of a channel layer under a magnetization free layer is less than the thickness d2 of a channel layer of a second section, that is, the thickness of a channel layer under a magnetization-fixed layer.

A magnetic sensor 100a is placed on a substrate and is covered by a non-magnetic insulating layer made of alumina or the like. As shown in FIG. 1, the magnetic sensor 100a includes a lower magnetic shield layer 1 and upper first magnetic shield layer 11 facing each other with a channel layer 5 therebetween and further includes an upper first magnetic shield layer 12, a first insulating layer 3 placed between the lower magnetic shield layer 1 and the channel layer 5, a first electrode 4 placed between the lower magnetic shield layer 1 and the channel layer 5, an antiferromagnetic layer 8 placed on a magnetization-fixed layer 7, and a second electrode 9 placed on the antiferromagnetic layer 8.

The magnetic sensor 100a includes the channel layer 5, which accumulates and transports the spins of electrons, a magnetization free layer 6 placed on a first section of the channel layer 5, and the magnetization-fixed layer 7, which is placed on a second section of the channel layer 5 that is different from the first section. Incidentally, the thickness d1 of the channel layer 5 under the magnetization free layer 6 is less than the thickness d2 of the channel layer 5 under the magnetization-fixed layer 7. The difference between the thickness d2 of the channel layer 5 under the magnetization-fixed layer 7 and the thickness d1 of the channel layer 5 under the magnetization free layer 6 has no significant influence on the effect of reducing noise. In particular, in the case of use as a thin-film magnetic reproducing head 100A, the thickness d1 of the channel layer 5 under the magnetization free layer 6 is preferably less than the thickness d2 of the channel layer 5 under the magnetization-fixed layer 7 because spatial resolution with respect to external magnetic flux becomes high.

In the case where the magnetization free layer 6 and the magnetization-fixed layer 7 are prepared so as to have different multilayer structures, these are prepared by separate processes in a thin-film process. For example, in the case where the magnetization free layer 6 is prepared after the magnetization-fixed layer is prepared, a surface of the channel layer 5 that is in contact with the magnetization free layer 6 is contaminated by a process for preparing the magnetization-fixed layer 7. Thus, when the magnetization free layer 6 is prepared, a surface of the channel layer 5 is preferably cleaned by, for example, chemical treatment or ion milling. The surface cleanliness of the channel layer 5 is improved by this process. Furthermore, as shown in FIG. 1, the channel layer 5 under the magnetization free layer 6 is etched by this process and the thickness d1 of the channel layer 5 under the magnetization free layer 6 becomes less than the thickness d2 of the channel layer 5 under the magnetization-fixed layer 7.

Figure 2:
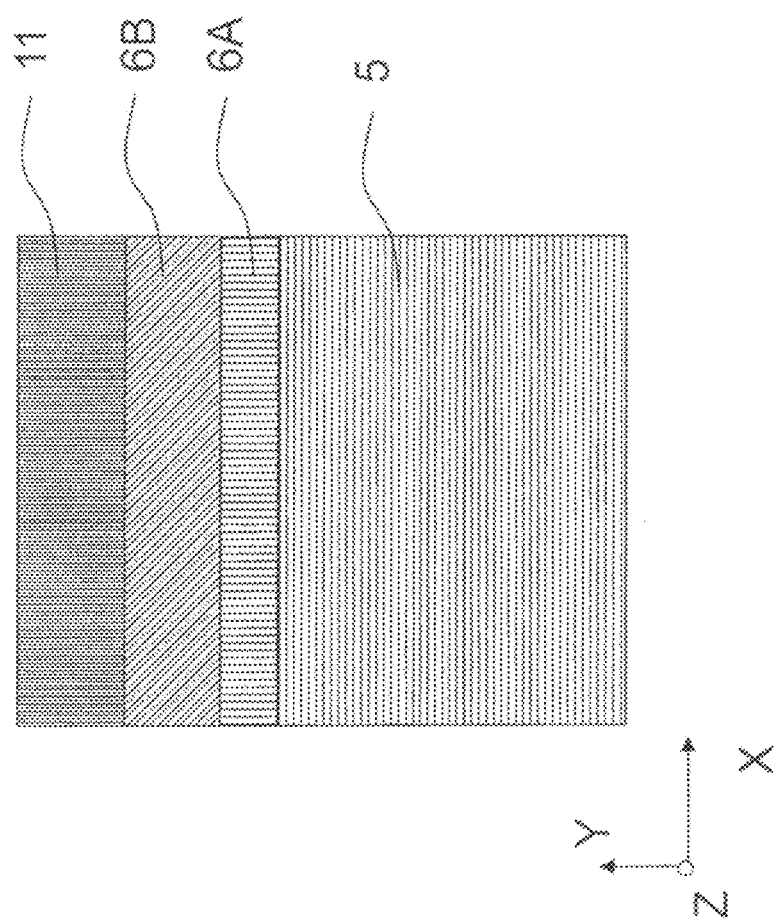
FIG. 2 is an illustration showing details of a magnetization free layer.

As shown in FIG. 2 in an enlarged manner, the magnetization free layer 6 is composed of a first ferromagnetic sub-layer 6B and a first tunnel sub-layer 6A placed between the channel layer 5 and the first ferromagnetic sub-layer 6B. The first ferromagnetic sub-layer 6B is a layer for detecting an external magnetic field to acutely detect the change in magnetization direction of a magnetic recording medium or the like. The magnetization free layer 6 is placed on the upper surface of the channel layer 5 and is located on the side where magnetic flux which is an object detected by the channel layer 5 enters.

The first tunnel sub-layer 6A is preferably a film in which an insulating film is a material. For example, MgO, Al2O3, MgAl2O4, TaOx, SiOx, and the like are cited. These insulating films are preferably crystalline. In this case, when a spin-polarized current passes through the tunnel sub-layer, spin polarizability is increased by a spin filter effect; hence, high output characteristics can be obtained. The first tunnel sub-layer 6A may be replaced with a Schottky barrier formed in the channel layer 5. When the channel layer 5 is made of a semiconductor material, the Schottky barrier is formed between metals in a ferromagnetic layer. Alternatively, the first tunnel sub-layer 6A may have both the function of an insulating film and the function of the Schottky barrier.

A ferromagnetic material, particularly a soft magnetic material, is used as a material for the first ferromagnetic sub-layer 6B. The following metal or alloy is cited: for example, a metal selected from the group consisting of Cr, Mn, Co, Fe, and Ni; an alloy containing one or more metals of the above group; or an alloy containing one or more metals selected from the above group and at least one or more elements of B, C, and N. In particular, CoFe, CoFeB, or NiFe is cited.

Figure 3:
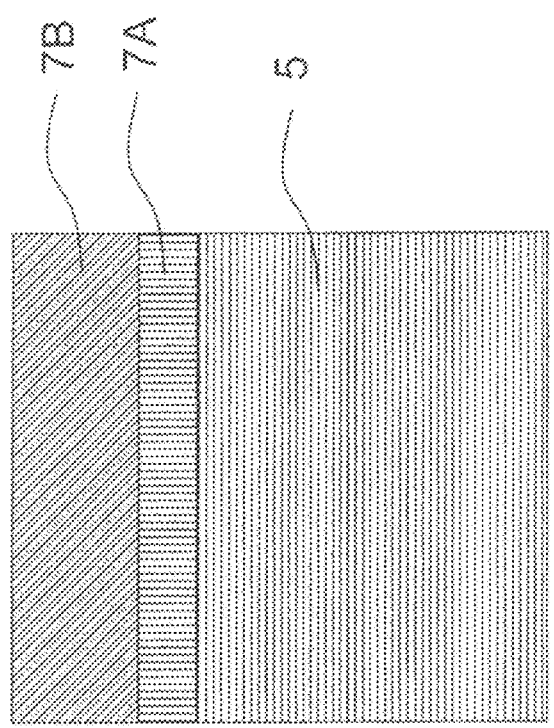
FIG. 3 is an illustration showing details of a magnetization-fixed layer.

As shown in FIG. 3 in an enlarged manner, the magnetization-fixed layer 7 is composed of a second ferromagnetic sub-layer 7B and a second tunnel sub-layer 7A placed between the second ferromagnetic sub-layer 7B and the channel layer 5. The second ferromagnetic sub-layer 7B is a sub-layer for injecting electrons having a predetermined spin into the channel layer 5. The magnetization-fixed layer 7 is placed on the upper surface of the channel layer 5 and is located on the side opposite to the side where magnetic flux which is an object detected by the channel layer 5 enters.

A ferromagnetic metal material with high spin polarizability can be used as a material for the second ferromagnetic sub-layer 7B. The following metal or alloy is cited: for example, a metal selected from the group consisting of Cr, Mn, Co, Fe, and Ni; an alloy containing one or more elements selected from the above group; or an alloy containing one or more metals selected from the above group and at least one or more elements of B, C, and N. In particular, CoFe or CoFeB is cited. Furthermore, in order to obtain high output, a Heusler alloy such as Co2FeSi is preferred. Heusler alloys include intermetallic compounds having the chemical composition X2YZ, where X is a Co-, Fe-, Ni-, or Cu-group transition metal element or a noble metal on the periodic table; Y is a Mn-, V-, Cr-, or Ti-group transition metal or can take the element species of X; and Z is a typical element of Group III to Group V. For example, Co2FeSi, Co2MoSi, and the like are cited.

The coercive force of the second ferromagnetic sub-layer 7B is greater than the coercive force of the first ferromagnetic sub-layer 6B. The magnetization of the second ferromagnetic sub-layer 7B is preferably fixed by at least one of a magnetization-fixing method using the antiferromagnetic layer 8 and a magnetization-fixing method making use of the shape anisotropy of the second ferromagnetic sub-layer 7B as described below. This allows the magnetization direction of the second ferromagnetic sub-layer 7B to be unlikely to respond to an external magnetic field.

In the case of using the magnetization-fixing method using the antiferromagnetic layer 8 as a method for fixing the magnetization of the second ferromagnetic sub-layer 7B, the antiferromagnetic layer 8 is placed on the second ferromagnetic sub-layer 7B as shown in FIG. 1. The exchange coupling of the antiferromagnetic layer 8 with the second ferromagnetic sub-layer 7B enables the magnetization direction of the second ferromagnetic sub-layer 7B to be fixed (unidirectional anisotropy to be imparted). This case allows the second ferromagnetic sub-layer 7B to have higher coercive force as compared to the case of the absence of the antiferromagnetic layer 8. Thus, a material used for the antiferromagnetic layer 8 is selected in accordance with a material used for the second ferromagnetic sub-layer 7B. The following alloy is cited as the antiferromagnetic layer 8: for example, an alloy which contains Mn and which exhibits antiferromagnetic properties, particularly an alloy containing Mn and at least one or more elements selected from Pt, Ir, and Fe. In particular, for example, IrMn and PtMn are cited.

On the other hand, in the case of using a method for fixing the magnetization of the second ferromagnetic sub-layer 7B by imparting shape anisotropy to the second ferromagnetic sub-layer 7B, the antiferromagnetic layer 8 can be omitted. Incidentally, it is needless to say that magnetization may be fixed using both the antiferromagnetic layer 8 and shape anisotropy.

As a material for the channel layer 5, a non-ferromagnetic conductive material is cited and a material having a large spin diffusion length and relatively low conductivity is preferably selected. For example, a metal material containing one or more elements selected from the group consisting of Ag, Cu, Al, and Mg is cited as a material for the channel layer 5. In particular, Ag, Cu, and MgB2 are preferred. Among metal materials, these metal materials have a relatively large spin diffusion length and can obtain high output with low noise.

A semiconductor material such as Si, SiGe, Ge, ZnO, GaAs, graphene, or diamond is preferred as a material for the channel layer 5. These materials have a very large spin diffusion length and can obtain high output.

The first insulating layer 3 prevents the spins of electrons accumulated in the channel layer 5 from flowing to the lower magnetic shield layer 1 side. The first insulating layer 3 is placed between the channel layer 5 and the lower magnetic shield layer 1. From the viewpoint of efficiently accumulating spins, the first insulating layer 3 is preferably placed on the lower surface of the channel layer 5 so as to extend from the magnetization-fixed layer 7 side to the magnetization free layer 6 side. For example, SiO2 is cited as a material for the first insulating layer 3.

The first electrode 4 is an electrode for applying a detection current to the magnetization-fixed layer 7. The first electrode 4 is placed on the lower surface of the channel layer 5, is located on the side opposite to the side where magnetic flux enters, and abuts on the first insulating layer 3. In FIG. 1, the channel layer 5 is electrically connected to the lower magnetic shield layer 1 through the first electrode 4. Thus, the lower magnetic shield layer 1, which is placed under the first electrode 4, can be used as an electrode for applying a detection current I to the magnetization-fixed layer 7. For example, a metal material such as Cu or Ta is used as the first electrode 4.

The second electrode 9 is an electrode for electrically connecting the upper first magnetic shield layer 12 to the antiferromagnetic layer 8 by applying a current to the magnetization-fixed layer 7 using the upper first magnetic shield layer 12 as an electrode. The second electrode 9 has the effect of suppressing the diffusion of atoms between the upper first magnetic shield layer 12 and the antiferromagnetic layer 8 or the magnetization-fixed layer 7. For example, a metal material such as Cu or Ta is used as the second electrode 9.

In the magnetic sensor according to the first embodiment, a current is applied between the magnetization-fixed layer 7 (second ferromagnetic sub-layer 7B) and the channel layer 5 and the voltage between the magnetization free layer 6 (first ferromagnetic sub-layer 6B) and the channel layer 5 is detected. Since a current is applied between the magnetization-fixed layer 7 (second ferromagnetic sub-layer 7B) and the channel layer 5, spins are injected into the channel layer 5 from the magnetization-fixed layer 7.

The resistance of the interface between the channel layer 5 of the first section and the magnetization free layer 6 is lower than the resistance of the interface between the channel layer 5 of the second section and the magnetization-fixed layer 7. The resistance of the interface between the channel layer 5 and the magnetization-fixed layer 7 is preferably higher than the spin resistance. In this case, the effect that the spins injected into the channel layer 5 from the magnetization-fixed layer 7 return from the channel layer 5 to the magnetization-fixed layer 7 in reverse can be suppressed and therefore the reduction of output can be suppressed. No spin injection occurs between the channel layer 5 and the magnetization free layer 6 and therefore the resistance of the interface between the channel layer 5 and the magnetization free layer 6 need not be high. The noise in a detection circuit can be reduced by reducing the resistance of the interface between the channel layer 5 and the magnetization free layer 6.

The spin resistance is defined by a formula below.

$$\frac{P^2 \lambda_N}{\sigma A} \qquad [\text{Math. 1}]$$

where P is the injection/detection efficiency of spins, $\lambda_N$ is the spin diffusion length, $\sigma$ is the electrical conductivity of a channel layer, and A is the cross-sectional area of the channel layer. However, the definition of the spin resistance by the above formula is limited to the case where the channel layer is such a conductor that can conduct a current. When the channel layer is a high-resistance material typified by an insulator, the spin resistance is not defined by the above formula.

EMBODIMENTS

First Embodiment

An example of a method for fabricating the magnetic sensor 100a according to the first embodiment is described below. First, the lower magnetic shield layer 1 and the first insulating layer 3 are continuously deposited on a substrate provided with a thermal silicon oxide film by a sputtering process in that order. Next, a portion of the first insulating layer 3 is ground by milling and the first electrode 4 is deposited on the ground portion.

Next, surfaces of the first insulating layer 3 and the first electrode 4 are polished by chemical mechanical polishing (CMP) so as to be planarized. Thereafter, the channel layer 5, the magnetization-fixed layer 7, and the antiferromagnetic layer 8 are continuously deposited on the planarized surfaces in that order. The channel layer 5 was 0.01 μm.

Furthermore, the channel layer 5 is ground by milling and chemical etching so as to have a strip shape with a longitudinal axis in an X-direction. Incidentally, the magnetization-fixed layer 7 is composed of the second tunnel sub-layer 7A and the second ferromagnetic sub-layer 7B and the channel layer 5, the second tunnel sub-layer 7A, and the second ferromagnetic sub-layer 7B are formed in that order. Incidentally, the channel layer 5 is Ag. The second tunnel sub-layer 7A is MgO of 2.2 nm. The second ferromagnetic sub-layer 7B is an alloy of cobalt and iron.

As the second section, the channel layer 5 and a film thereon are ground by ion milling such that the magnetization-fixed layer 7 is formed so as to have a strip shape with a longitudinal axis in a Z-direction, and an insulating film is provided. Thereafter, as the first section, the channel layer 5 is ground so as to take the form of the rectangular magnetization free layer 6 and the magnetization free layer 6 is deposited on the channel layer 5, whereby the magnetization free layer 6 is formed. In this operation, the thickness d1 of the channel layer 5 under the magnetization free layer 6 was reduced to 0.005 μm. The magnetization free layer 6 is prepared at 0.1 μm in the X-direction and 0.1 μm in the Z-direction and the magnetization-fixed layer 7 was prepared at 0.1 μm in the X-direction and 10 μm in the Z-direction. Incidentally, the magnetization free layer 6 is composed of the first tunnel sub-layer 6A and the first ferromagnetic sub-layer 6B and the channel layer 5, the first tunnel sub-layer 6A, and the first ferromagnetic sub-layer 6B are formed in that order. The first tunnel sub-layer 6A is MgO of 0.8 nm. The first ferromagnetic sub-layer 6B is an alloy of cobalt and iron. The first tunnel sub-layer 6A is thinner than the second tunnel sub-layer 7A and therefore the resistance of the interface between the channel layer 5 and the magnetization free layer 6 is lower than the resistance of the interface between the channel layer 5 and the magnetization-fixed layer 7. In the process up to this stage, the thickness d1 of the channel layer 5 under the magnetization free layer 6 is 0.005 μm and the thickness d2 of the channel layer 5 under the magnetization-fixed layer 7 is 0.01 μm.

A superfluous layer on the magnetization free layer 6 is ground, whereby the upper first magnetic shield layer 11 is formed. On the other hand, after a portion of the second phosphor material 13 on the antiferromagnetic layer 8 is ground and the second electrode 9 is then deposited, the upper first magnetic shield layer 12 is formed. As described above, the magnetic sensor is completed.

The operation of the magnetic sensor 100a, shown in FIG. 1, according to the first embodiment is described below. In order to apply a detection current to the magnetization-fixed layer 7, the lower magnetic shield layer 1 and the upper first magnetic shield layer 12 are electrically connected to a current source 70. In order to measure the voltage generated between the channel layer 5 and the magnetization free layer 6 (first ferromagnetic sub-layer 6B), the channel layer 5 and the upper first magnetic shield layer 11 are electrically connected to a voltage-measuring system 80. In the case where the upper first magnetic shield layer 11 is spaced apart from the first ferromagnetic sub-layer 6B and is insulated from the first ferromagnetic sub-layer 6B, the channel layer 5 and the first ferromagnetic sub-layer 6B may be electrically connected to the voltage-measuring system 80.

First, a detection current I is applied to the magnetization-fixed layer 7 of the magnetic sensor 100a. For example, a detection current I is applied from the current source 70 to the lower magnetic shield layer 1, the first electrode 4, the channel layer 5, the magnetization-fixed layer 7, the antiferromagnetic layer 8, the second electrode 9, and the upper first magnetic shield layer 12 in that order as shown in FIG. 1.

When a detection current I is applied from the channel layer 5 to the second ferromagnetic sub-layer 7B, which is ferromagnetic, as described above, electrons each having a spin corresponding to the magnetization direction of the second ferromagnetic sub-layer 7B are injected into the channel layer 5 from the second ferromagnetic sub-layer 7B (spin injection). The spins are accumulated in the channel layer 5 (spin accumulation) and diffuse from the magnetization-fixed layer 7 side to the magnetization free layer 6 side. In the case of applying a current in the opposite direction, electrons having spins are extracted from the channel layer 5 to the second ferromagnetic sub-layer 7B. In this case, spins are accumulated in the channel layer 5 alike.

A voltage output is generated between the first ferromagnetic sub-layer 6B and the channel layer 5 depending on the relative angle between the magnetization direction of the first ferromagnetic sub-layer 6B, which is varied in magnetization direction by a magnetic field from outside, and the magnetization direction of the second ferromagnetic sub-layer 7B. In this embodiment, the voltage generated between the channel layer 5 and the upper first magnetic shield layer 11 is detected. In this way, the magnetic sensor 100a can be used as an external magnetic field sensor.

An element prepared in an example was measured by a non-local measurement method, for example, a method described in Applied Physics Express 2, 053003 (2009). As shown in FIG. 1, a current was applied from a first electrode 4 to a magnetization-fixed layer 7 (second ferromagnetic sub-layer 7B) through a channel layer 5 and the voltage between a magnetization free layer 6 (first ferromagnetic sub-layer 6B) and the channel layer 5 was measured. As a result, in such a state that a current of 5 mA was applied, the output was 27 μV. The noise defined by the amplitude of vibration of a signal with respect to an output waveform was 0.4 μV.

The resistance of the interface between the channel layer 5 and the magnetization free layer 6 or the magnetization-fixed layer 7 was measured by a three-terminal method. For example, in the case of measuring the resistance of the interface between the magnetization free layer 6 and the channel layer 5 as shown in FIG. 1, a current is applied between a first ferromagnetic sub-layer 6B and the channel layer 5 and the voltage between the first ferromagnetic sub-layer 6B and the channel layer 5 is measured. In this operation, in order to primarily measure the resistance of the interface therebetween, for a terminal on the channel layer 5 side, the voltage is measured with a terminal in a direction different from the direction in which a current flows in the channel layer 5. The voltage observed by this measurement method is the voltage drop due to the sum of the resistance of the first ferromagnetic sub-layer 6B and the resistance of the interface between the magnetization free layer 6 and the channel layer 5 and the resistance of the interface therebetween is primarily measured because the resistance of the first ferromagnetic sub-layer 6B is low. The resistance of the interface between the magnetization free layer 6 and the channel layer 5 was 10Ω and the resistance of the interface between the magnetization-fixed layer 7 and the channel layer 5 was 78Ω as measured in this way.

Second Embodiment

Figure 4:
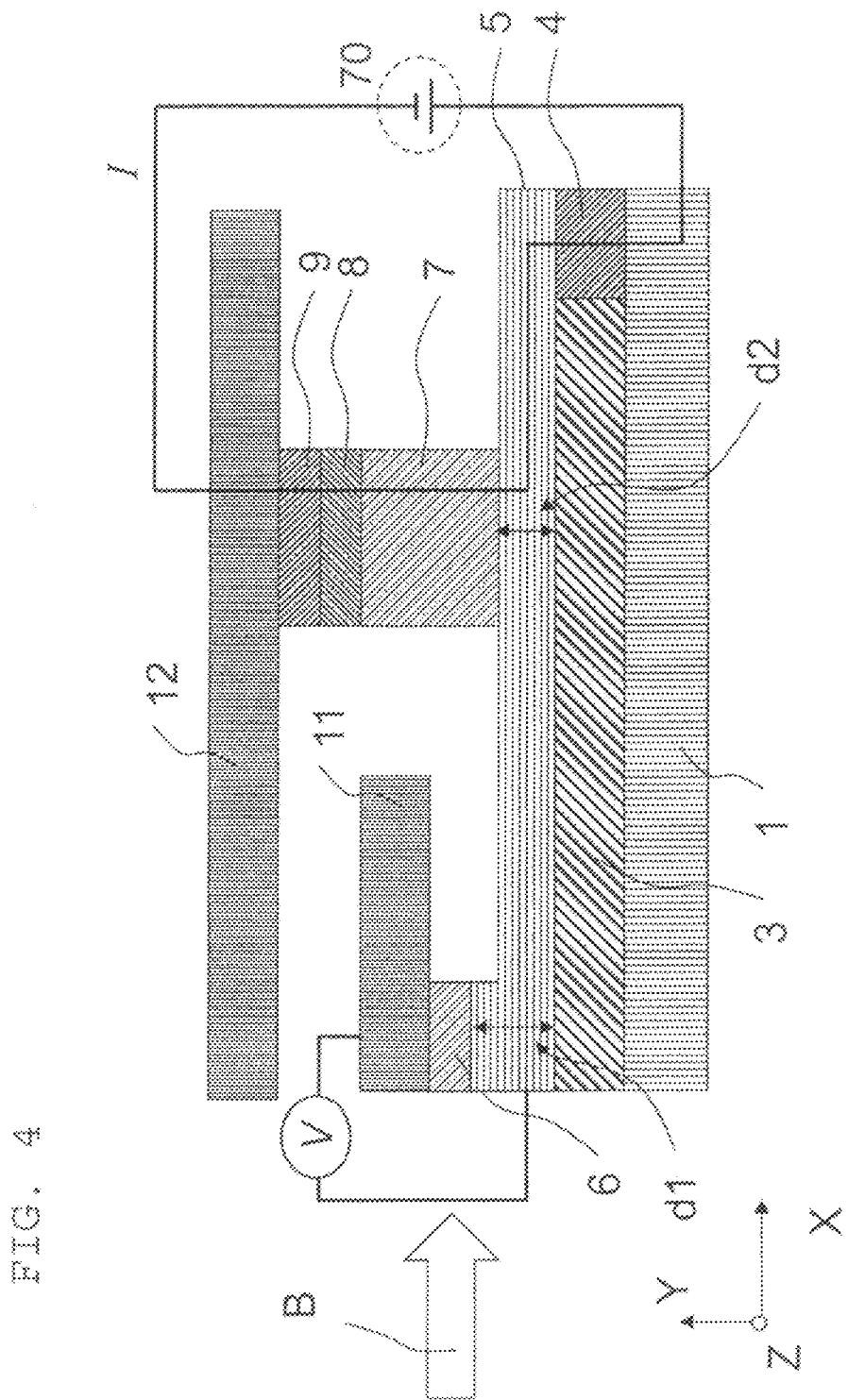
FIG. 4 is a schematic sectional view of a magnetic sensor different in configuration from FIG. 1.

In Example 2, a magnetic sensor having a configuration as shown in FIG. 4 was prepared in substantially the same way as that described in Example 1 except that the order of forming a magnetization free layer 6 and a magnetization-fixed layer 7 was reversed.

Surfaces of a first insulating layer 3 and a first electrode 4 are polished by chemical mechanical polishing (CMP) so as to be planarized. Thereafter, a channel layer 5, the magnetization free layer 6, and a second insulating layer 13 are continuously deposited on the planarized surfaces in that order. The channel layer 5 was 0.01 μm. The channel layer 5 is ground by milling and chemical etching so as to have a strip shape with a longitudinal axis in an X-direction. Incidentally, the magnetization free layer 6 is composed of a first tunnel sub-layer 6A and a first ferromagnetic sub-layer 6B and the channel layer 5, the first tunnel sub-layer 6A, and the first ferromagnetic sub-layer 6B are formed in that order. Incidentally, the channel layer 5 is Ag. The first tunnel sub-layer 6A is MgO of 0.8 nm. The first ferromagnetic sub-layer 6B is an alloy of cobalt and iron.

The channel layer 5 and a film thereon are ground by ion milling such that the magnetization free layer 6 is formed so as to have a rectangular shape, and an insulating film is formed. Thereafter, the channel layer 5 is ground so as to take the form of the magnetization-fixed layer 7 having a strip shape with a longitudinal axis in a Z-direction and the magnetization-fixed layer 7 is formed on the channel layer 5. In this operation, the thickness d2 of the channel layer 5 under the magnetization-fixed layer 7 was reduced to 0.005 μm. The magnetization free layer 6 is prepared at 0.1 μm in the X-direction and 0.1 μm in the Z-direction and the magnetization-fixed layer 7 was prepared at 0.1 μm in the X-direction and 10 μm in the Z-direction. Incidentally, the magnetization-fixed layer 7 is composed of a second tunnel sub-layer 7A and a second ferromagnetic sub-layer 7B and the channel layer 5, the second tunnel sub-layer 7A, and the second ferromagnetic sub-layer 7B are formed in that order. The second tunnel sub-layer 7A is MgO of 2.2 nm. The second ferromagnetic sub-layer 7B is an alloy of cobalt and iron. The first tunnel sub-layer 6A is thinner than the second tunnel sub-layer 7A and therefore the resistance of the interface between the channel layer 5 and the magnetization free layer 6 is lower than the resistance of the interface between the channel layer 5 and the magnetization-fixed layer 7. In the process up to this stage, the thickness d1 of the channel layer 5 under the magnetization free layer 6 is 0.01 μm and the thickness d2 of the channel layer 5 under the magnetization-fixed layer 7 is 0.005 μm.

As a result of performing evaluation in substantially the same way as that described in Example 1, in such a state that a current of 5 mA was applied, the output was 29 μV. The noise defined by the amplitude of vibration of a signal with respect to an output waveform was 0.8 μV. Furthermore, the resistance of the interface between the magnetization free layer 6 and the channel layer 5 was 8Ω and the resistance of the interface between the magnetization-fixed layer 7 and the channel layer 5 was 80Ω.

Comparative Example 1

In Comparative Example 1, an element was prepared in substantially the same way as that described in Examples 1 and 2. However, a magnetization-fixed layer 7 and a magnetization free layer 6 were prepared by the same process. The thickness of a channel layer 5 was as follows: d1=0.005 μm and d2=0.005 μm. First, a lower magnetic shield layer 1 and a first insulating layer 3 are continuously deposited on a substrate, provided with a thermal silicon oxide film, by a sputtering process in that order. Next, a portion of the first insulating layer 3 is ground by milling and a first electrode 4 is deposited on the ground portion.

Next, surfaces of the first insulating layer 3 and the first electrode 4 are polished by chemical mechanical polishing (CMP) so as to be planarized. Thereafter, the channel layer 5, the magnetization free layer 6, the magnetization-fixed layer 7, and an antiferromagnetic layer 8 are continuously deposited on the planarized surfaces in that order. The channel layer 5 was 0.005 μm. In Comparative Example 1, the magnetization free layer 6 and the magnetization-fixed layer 7 were the same multilayer film and were formed in the form of the same film during deposition.

Furthermore, the channel layer 5 is ground by milling and chemical etching so as to have a strip shape with a longitudinal axis in an X-direction. Incidentally, the magnetization-fixed layer 7 is composed of a second tunnel sub-layer 7A and a second ferromagnetic sub-layer 7B and the channel layer 5, the second tunnel sub-layer 7A, and the second ferromagnetic sub-layer 7B are formed in that order. The magnetization free layer 6 is composed of a first tunnel sub-layer 6A and a first ferromagnetic sub-layer 6B and the channel layer 5, the first tunnel sub-layer 6A, and the first ferromagnetic sub-layer 6B are formed in that order. Incidentally, the channel layer 5 is Ag. The first tunnel sub-layer 6A and the second tunnel sub-layer 7A are MgO of 2.2 nm. The first ferromagnetic sub-layer 6B and the second ferromagnetic sub-layer 7B is an alloy of cobalt and iron.

As a second section, the channel layer 5 and a film thereon are ground by ion milling such that the magnetization free layer 6 and the magnetization-fixed layer 7 are formed so as to have a rectangular shape and a strip shape with a longitudinal axis in a Z-direction, respectively, and an insulating film is provided. In this operation, a structure in which the aspect ratio of the shape of the magnetization-fixed layer 7 is greater than the aspect ratio of the magnetization free layer 6 is obtained. That is, the magnetization free layer 6 was prepared at 0.1 μm in the X-direction and 0.1 μm in the Z-direction and the magnetization-fixed layer 7 was prepared at 0.1 μm in the X-direction and 10 μm in the Z-direction. Next, the antiferromagnetic layer 8 placed on the magnetization free layer 6 was ground by ion milling. Thereafter, an upper first magnetic shield layer 11, a second electrode 9, and an upper first magnetic shield layer 12 were formed in substantially the same manner as that described in Example 1.

As a result of performing evaluation in substantially the same way as that described in Example 1, in such a state that a current of 5 mA was applied, the output was 30 RV. The noise defined by the amplitude of vibration of a signal with respect to an output waveform was 4 μV. Furthermore, the resistance of the interface between the magnetization free layer 6 and the channel layer 5 was 75Ω and the resistance of the interface between the magnetization-fixed layer 7 and the channel layer 5 was 75Ω.

TABLE 1

|  | Resistance of interface of d1 (Ω) | Resistance of interface of d2 (Ω) | Output (μV) | Noise (μV) | S/N |
|---|---|---|---|---|---|
| Example 1 | 10 | 78 | 27 | 0.4 | 67.5 |
| Example 2 | 8 | 80 | 29 | 0.8 | 33.8 |
| Comparative Example 1 | 75 | 75 | 30 | 4 | 7.5 |

Results obtained in Examples 1 and 2 and Comparative Example 1 were summarized in Table 1. Comparisons between the examples and the comparative example show that outputs are substantially equal and the noise levels of the examples are several times or more low. Accordingly, it is clear that when the resistance of the interface between a channel layer 5 and a magnetization free layer 6 is lower than the resistance of the interface between the channel layer 5 and a magnetization-fixed layer 7, there is the effect that output is maintained and noise can be reduced.

In the first embodiment, the following example is described: an example in which the first tunnel sub-layer 6A is present between the channel layer 5 and the first ferromagnetic sub-layer 6B and the second tunnel sub-layer 7A is present between the channel layer 5 and the second ferromagnetic sub-layer 7B. One or both of the first tunnel sub-layer 6A and the second tunnel sub-layer 7A, which are tunnel barriers, may be replaced with Schottky barriers. Both a tunnel barrier layer and a Schottky barrier may be placed between the channel layer 5 and the first ferromagnetic sub-layer 6B or between the channel layer 5 and the second ferromagnetic sub-layer 7B. The magnetization free layer 6 need not include the first tunnel sub-layer 6A and the channel layer 5 may be in contact with the first ferromagnetic sub-layer 6B. The need not include the second tunnel sub-layer 7A and the channel layer 5 may be in contact with the second ferromagnetic sub-layer 7B. Even in this case, noise, such as Johnson noise, proportional to resistance can be reduced in such a way that the resistance of the interface between the channel layer 5 and the magnetization free layer 6 is adjusted to be lower than the resistance of the interface between the channel layer 5 and the magnetization-fixed layer 7.

When a tunnel barrier layer or a Schottky barrier is placed between the channel layer 5 and the first ferromagnetic sub-layer 6B and between the channel layer 5 and the second ferromagnetic sub-layer 7B, the resistance of the interface between the channel layer 5 and the magnetization free layer 6 can be adjusted to be lower than the resistance of the interface between the channel layer 5 and the magnetization-fixed layer 7 in such a way that, for example, the thickness of these barriers differs between the magnetization free layer 6 and the magnetization-fixed layer 7. When the channel layer 5 is in contact with the first ferromagnetic sub-layer 6B and the channel layer 5 is in contact with the second ferromagnetic sub-layer 7B, the resistance of the interface between the channel layer 5 and the magnetization free layer 6 can be adjusted to be lower than the resistance of the interface between the channel layer 5 and the magnetization-fixed layer 7 in such a way that, for example, the surface condition of the channel layer 5 differs between the first ferromagnetic sub-layer 6B and the second ferromagnetic sub-layer 7B.
(Second Mode)

A magnetic sensor according to a second embodiment is described below. The second embodiment is similar to the first embodiment. After the first embodiment was formed, a writing section was prepared in a magnetic head. Incidentally, the magnetic sensor 100a according to the first embodiment functions as the writing section in the magnetic head.

Figure 5:
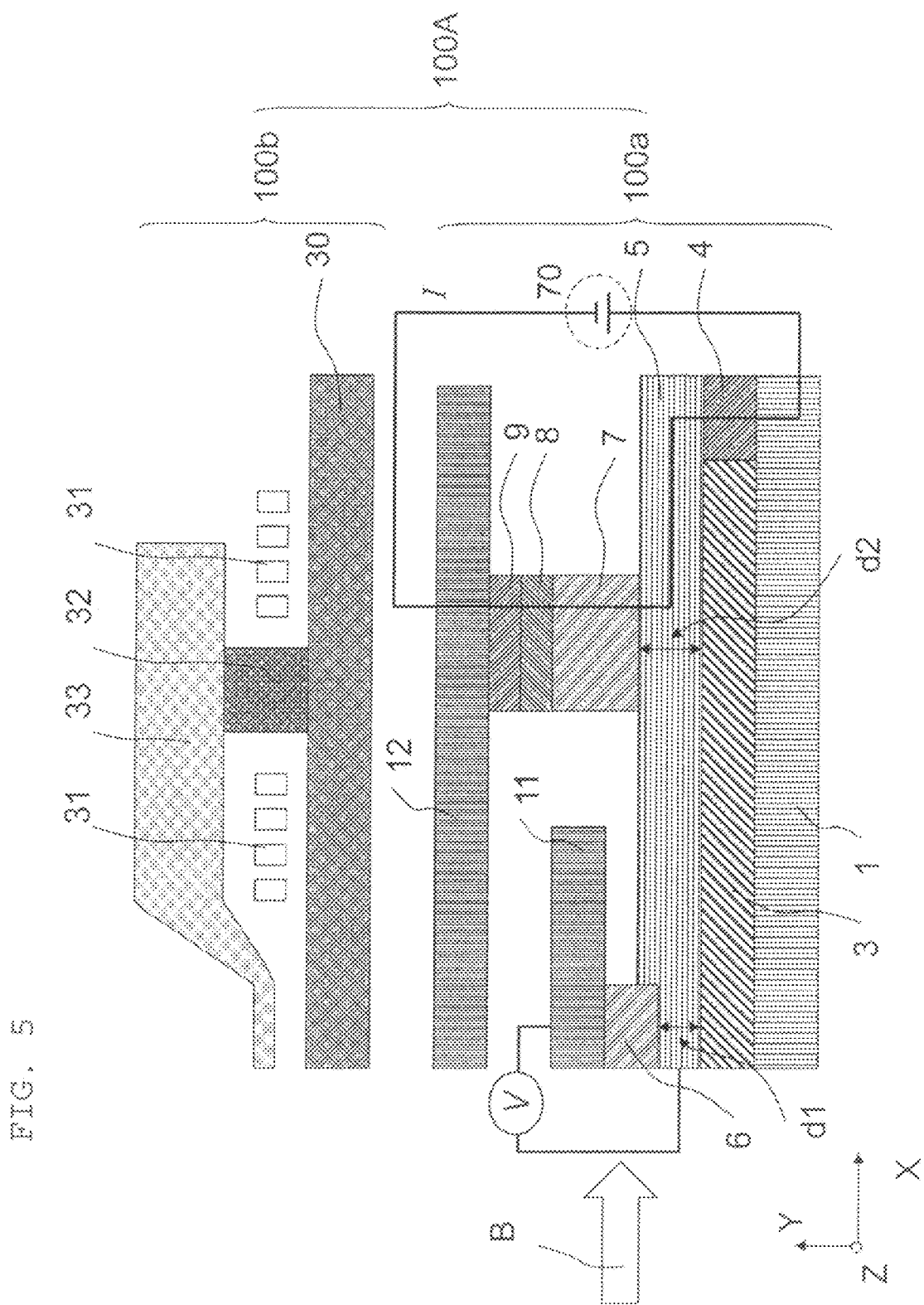

FIG. 5 is a schematic view of a thin-film magnetic recording/reproducing head 100A including the magnetic sensor 100a. The magnetic sensor 100a is applied to a reading head section and a recording head section 100b for writing is placed. In the recording head section 100b, a contact section 32 and a main magnetic pole 33 are placed on a return yoke 30 and these form the path of magnetic flux. A thin-film coil 31 is placed so as to surround the contact section 32. When a recording current is applied to the thin-film coil 31, magnetic flux is expelled from the tip of the main magnetic pole 33, whereby information can be recorded on a recording layer of a magnetic recording medium such as a hard disk. As described above, the thin-film magnetic recording/reproducing head 100A, which can detect magnetic flux from a microregion of a recording medium or the like, can be provided using a magnetic sensor according to the present invention.

In this embodiment, a magnetization free layer detecting external magnetic flux is covered by magnetic shields and the thickness d1 of a channel layer of a first section, that is, the thickness of the channel layer under a magnetization free layer is less than the thickness d2 of the channel layer of a second section, that is, the thickness of the channel layer under a magnetization-fixed layer; hence, the distance (read gap) between the upper and lower magnetic shields is narrow and therefore spatial resolution becomes higher.
(Third Mode)

A plurality of magnetic sensors arranged as shown in FIG. 6 can be used as a biomagnetic sensor. A preparation method is substantially the same as that described in the first embodiment and provides a structure which has a shape shown in FIG. 6, in which elements of the first embodiment are horizontally arranged, and in which magnetic shields 16 are placed between the elements. Furthermore, a structure in which a spin flow in each other's elements does not flow into other elements was obtained by providing inter-element insulating layers 20 as shown in FIG. 6.

When a current is applied between a magnetization-fixed layer 7 and channel layers 5, spins are injected into the channel layers 5. The spins injected into the channel layers 5 are transported to first ferromagnetic sub-layers 6B of magnetization free layers 6 and output can be obtained depending on the relative angle between the magnetization direction of each first ferromagnetic sub-layer 6B and the direction of the injected spins. Magnetic flux entering in an X-direction turns the magnetization direction of the first ferromagnetic sub-layer 6B and therefore the magnitude of the magnetic flux can be detected by measuring the voltage between the first ferromagnetic sub-layer 6B and each channel layer 5. Furthermore, as shown in FIG. 6, a plurality of the magnetization free layers 6 are arranged, whereas the number of injection sources of spins is 1. Therefore, the magnitude and shape of an external magnetic field can be measured by comparing the voltages of the neighboring magnetization free layers 6 to each other.

The less the distance between the magnetization-fixed layer 7 and each magnetization free layer 6 is, the higher output a spin accumulation magnetic sensor generally obtains. Arranging a plurality of the spin accumulation magnetic sensors enables where fine magnetic particles are located, the number of the fine magnetic particles, and the size thereof to be detected. For example, specific cells are modified with magnetic beads and are moved above such a magnetic sensor as shown in FIG. 6. When the magnetic beads approach the magnetic sensor shown in FIG. 4, the magnetic sensor detects the magnetic flux from the magnetic beads. The number and size of the magnetic beads can be judged by analyzing signals detected by the magnetic sensor.

REFERENCE SIGNS LIST

100A Thin-film magnetic recording/reproducing head
100a Magnetic sensor
100b Recording section
1 Lower magnetic shield layer
3 First insulating layer
4 First electrode
5 Channel layer
6 Magnetization free layer
6A First tunnel sub-layer
6B First ferromagnetic sub-layer
7 Magnetization-fixed layer
7A Second tunnel sub-layer
7B Second ferromagnetic sub-layer
8 Antiferromagnetic layer
9 Second electrode
11 Upper first magnetic shield layer
12 Upper first magnetic shield layer
16 Magnetic shields
20 Inter-element insulating layers
30 Return yoke
31 Thin-film coil
32 Contact section
33 Main magnetic pole
B Magnetization direction

What is claimed is:

1. A magnetic sensor characterized by comprising:
   a channel layer;
   a magnetization free layer placed on a first section of the channel layer; and
   a magnetization-fixed layer placed on a second section of the channel layer,
   wherein a thickness of the channel layer of the first section is different from a thickness of the channel layer of the second section and a resistance of an interface between the channel layer and the magnetization free layer is lower than a resistance of an interface between the channel layer and the magnetization-fixed layer.

2. The magnetic sensor according to claim 1, wherein the thickness of the channel layer of the first section is less than the thickness of the channel layer of the second section.

3. The magnetic sensor according to claim 1, wherein the thickness of the channel layer of the second section is less than the thickness of the channel layer of the first section.

4. A magnetic head comprising a reading head section including the magnetic sensor according to claim 1 and a recording head section for writing.

5. A biomagnetic sensor, comprising an arrangement of a plurality of magnetic sensors according to claim 1.

* * * * *